US008352753B2

(12) United States Patent
Schoegler et al.

(10) Patent No.: US 8,352,753 B2
(45) Date of Patent: Jan. 8, 2013

(54) MICROCONTROLLER AND METHOD FOR STARTING AN APPLICATION PROGRAM ON A MICROCONTROLLER BY WHICH UNAUTHORIZED ACCESS TO DATA CONTAINED IN OR PROCESSED BY THE MICROCONTROLLER IS PREVENTED

(75) Inventors: Werner Schoegler, Graz (AT); Michael Böhm, Graz (AT)

(73) Assignee: Austriamicrosystems AG, Unterpremstatten (AT)

( * ) Notice: Subject to any disclaimer, the term of this patent is extended or adjusted under 35 U.S.C. 154(b) by 622 days.

(21) Appl. No.: 12/441,458

(22) PCT Filed: Sep. 7, 2007

(86) PCT No.: PCT/EP2007/059424
§ 371 (c)(1),
(2), (4) Date: Nov. 16, 2009

(87) PCT Pub. No.: WO2008/031776
PCT Pub. Date: Mar. 20, 2008

(65) Prior Publication Data
US 2010/0146302 A1    Jun. 10, 2010

(30) Foreign Application Priority Data
Sep. 14, 2006    (DE) .......................... 10 2006 043 167

(51) Int. Cl.
*G06F 11/30* (2006.01)
(52) U.S. Cl. ...................................................... 713/194
(58) Field of Classification Search .................. 713/194, 713/193
See application file for complete search history.

(56) References Cited

U.S. PATENT DOCUMENTS

| 4,937,732 A * | 6/1990 | Brundisini ...................... 700/16 |
| 6,223,284 B1 * | 4/2001 | Novoa et al. .................. 713/100 |

(Continued)

FOREIGN PATENT DOCUMENTS
EP    0 606 771    12/1993
(Continued)

OTHER PUBLICATIONS

R. F. Buskey, et al., "Protected JTAG", Parallel Processing Workshops, 2006, ICPP 2006 Workshops, Int'l Conference in Columbus, OH, pp. 405-414, Aug. 14, 2006, XP010938142.

*Primary Examiner* — Kambiz Zand
*Assistant Examiner* — Abiy Getachew
(74) *Attorney, Agent, or Firm* — Cozen O'Connor

(57) ABSTRACT

A microcontroller comprises a microprocessor (1), a test interface (4) and an internal non-erasable memory (2). First control means (6) are provided which are able to activate and deactivate the test interface (4), and second control means (7) are provided which are able to activate and deactivate the internal non-erasable memory (2). The microprocessor (1) of the microcontroller comprises control outputs (101) which are connected with the first and second control means (6, 7). With appropriate timing of activation and deactivation of the test interface (4) and the internal non-erasable memory (2), the microcontroller offers the possibility of preventing an unauthorized access to contents of the internal non-erasable memory (2) without limiting the usability of the test interface (4) for the development of application programs. The microcontroller further offers the possibility to entirely block access to data which are stored in the microcontroller or have been processed within the microcontroller via the test interface (4).

17 Claims, 5 Drawing Sheets

U.S. PATENT DOCUMENTS

| | | | |
|---|---|---|---|
| 6,711,684 B1 * | 3/2004 | Moroney et al. | 713/191 |
| 7,822,995 B2 * | 10/2010 | Hars et al. | 713/193 |
| 2002/0018380 A1 | 2/2002 | Shinmori | |
| 2002/0133662 A1 * | 9/2002 | Cheung | 710/310 |
| 2002/0174342 A1 * | 11/2002 | Freeman et al. | 713/182 |
| 2003/0014653 A1 * | 1/2003 | Moller et al. | 713/193 |
| 2005/0039039 A1 | 2/2005 | Moyer et al. | |
| 2005/0066189 A1 | 3/2005 | Moss et al. | |
| 2005/0144364 A1 | 6/2005 | Tu et al. | |

FOREIGN PATENT DOCUMENTS

| | | |
|---|---|---|
| EP | 1 276 033 | 7/2001 |

* cited by examiner

A)

B)

MICROCONTROLLER AND METHOD FOR STARTING AN APPLICATION PROGRAM ON A MICROCONTROLLER BY WHICH UNAUTHORIZED ACCESS TO DATA CONTAINED IN OR PROCESSED BY THE MICROCONTROLLER IS PREVENTED

RELATED APPLICATIONS

This is a U.S. national stage under 35 USC §371 of application No. PCT/EP2007/059424, filed on Sep. 7, 2007.

This application claims the priority of German Patent Application No. 10 2006 043 167.7 filed Sep. 14, 2006, the entire content of which is hereby incorporated by reference.

FIELD OF THE INVENTION

The invention relates to a microcontroller comprising a microprocessor, a test interface and an internal non-erasable memory. The invention further relates to a method for starting an application program on such a microcontroller.

BACKGROUND OF THE INVENTION

Microcontrollers of the type initially mentioned are used on a large scale, for instance in multimedia devices such as music or video players or for control or measuring purposes. In this context, the test interface of the microcontroller serves for fault diagnosis and the function check during the development phase of application and/or system programs which are supposed to be executed on the microcontroller. In particular, interfaces according to the JTAG specification (Joint European Test Action Group) developed by the Institute of Electrical and Electronics Engineers (IEEE) and published under the designation IEEE 1149.1 have become established as test interfaces.

The test interface, however, involves the risk that any data stored within the microcontroller or processed by the microprocessor of the microcontroller might be read out by unauthorized parties even after completion of the development phase. This may be problematic in particular with those microcontrollers which are used in the multimedia domain and are adapted for processing multimedia data (pieces of music, movies etc.), which are subject to the so-called Digital Rights Management (DRM).

SUMMARY OF THE INVENTION

It is therefore the object of the invention to provide a method for starting application programs on a microcontroller by which unauthorized access to data contained in the microcontroller or processed by it is prevented. It is a further object of the invention to provide a microcontroller which is suitable for carrying out the method.

According to a first aspect of the invention, in a microcontroller of the type mentioned above, first control means are provided within the microcontroller which are able to activate and deactivate the test interface, and second control means are provided which are able to activate and deactivate the internal non-erasable memory. The microprocessor of the microcontroller comprises control outputs which are coupled to the first and second control means.

Through the control outputs, it is possible to activate or deactivate the test interface and/or the internal non-erasable memory of programs which are executed on the microprocessor. With suitable timing of activation and deactivation of the test interface and the internal non-erasable memory, the microcontroller, on the one hand, offers the possibility to prevent unauthorized access to contents of the internal non-erasable memory without limiting the usability of the test interface for the development of application programs. On the other hand, with suitable timing of activation and deactivation of the test interface and the internal non-erasable memory, the microcontroller offers the possibility to entirely block access to data stored in the microcontroller or processed within the microcontroller via the test interface.

In advantageous further developments of the first aspect, the test interface is an interface according to the JTAG specification and/or the internal non-erasable memory is a mask-programmed ROM (Read Only Memory), a PROM (Programmable ROM) or a fused ROM.

In another advantageous further development of the first aspect, the first control means are adapted such that the test interface can be activated and deactivated by the microprocessor. It is particularly preferred to adapt the first control means such that the test interface can be deactivated by the microprocessor, this process being irreversible for the latter. "Irreversible" within the framework of the application means that the test interface can be deactivated until removal and re-supply of a supply voltage of the microcontroller.

In another advantageous further development of the first aspect, the second control means are adapted such that the internal non-erasable memory can be activated and deactivated by the microcontroller. It is particularly preferred to adapt the second control means such that the internal non-erasable memory can be deactivated by the microprocessor, this process being irreversible for the latter. Again, "irreversible" relates to the time period until removal and re-supply of the supply voltage.

According to a second aspect of the invention, a method is provided for starting an application program on a microcontroller comprising a test interface, wherein the test interface can be activated and deactivated and the microcontroller further comprises an internal non-erasable memory which can be deactivated and activated. According to the method, the test interface is first deactivated and the internal non-erasable memory is activated. A first section of a bootloader program provided in the internal non-erasable memory is executed. During execution of the first section of the bootloader program, a copy of a second section of the bootloader program is prepared in a memory. In addition, a copy of an application program provided in an external non-volatile memory is prepared in the memory during execution of the first section of the bootloader program. After that, the copy of the second section of the bootloader program is executed in the memory and the internal non-erasable memory is deactivated during execution. Subsequently the test interface is activated and the copy of the application program is executed in the memory.

The process of cutting off the internal non-erasable memory scheduled by the boot program which is situated in the internal non-erasable memory at the beginning of the process is made possible in that the boot program is subdivided in two sections the second section of which is responsible for deactivating the internal memory is copied into the memory and executed from there. In this way, any data contained in the first section of the bootloader program are reliably protected against unauthorized access via the test interface.

In an advantageous further development of the second aspect, the copy of the application program is checked during the execution of the copy of the second section of the bootloader program and the test interface is activated only if the copy of the application program meets predefined criteria. It is possible in this way to prevent access to the microcontroller via the test interface in case of unauthorized or manipulated application programs.

In an advantageous further development of the second aspect, the application program is stored on the external non-volatile memory in encrypted form and is decrypted during the execution of the first section of the bootloader program prior to the preparation of its copy by means of a key which is stored in the internal non-erasable memory. In this way, the application program on the external non-volatile memory can be protected against any undesired inspection and manipulation.

BRIEF DESCRIPTION OF THE DRAWINGS

Embodiments of the invention will be described in more detail below with the aid of five figures.

DETAILED DESCRIPTION OF THE DRAWINGS

Figure 1:
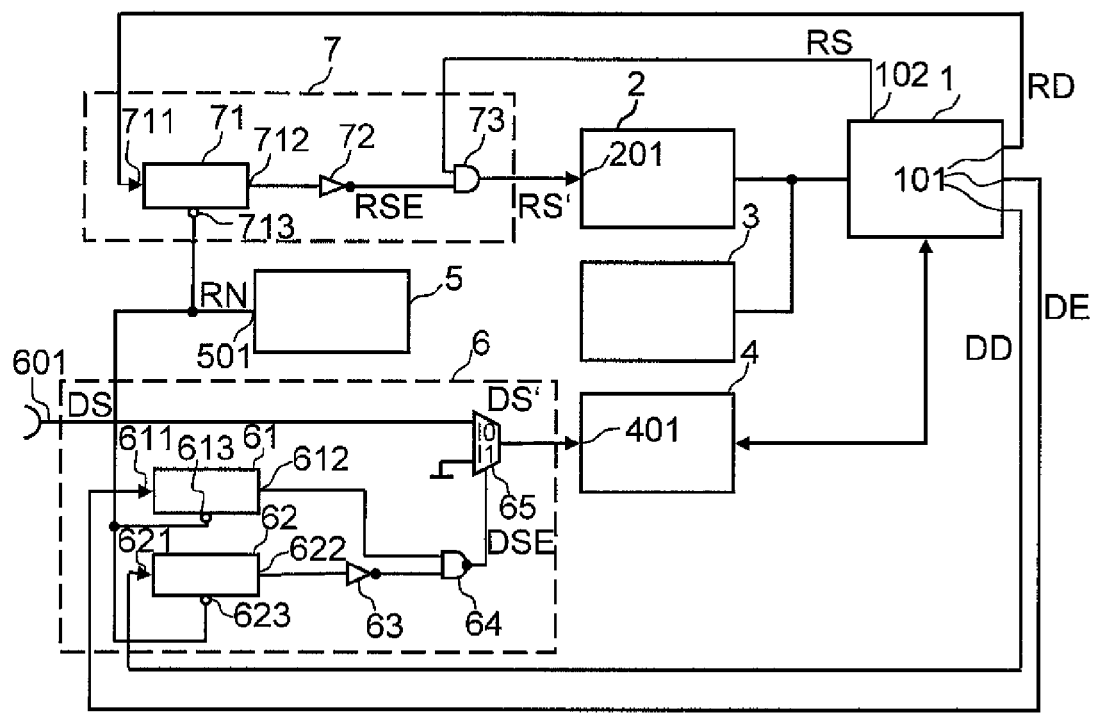
FIG. 1 shows a block diagram of a microcontroller including a microprocessor, a test interface and an internal non-erasable memory.

The microcontroller an example of which is schematically illustrated in FIG. 1 includes a microprocessor 1 having control outputs 101 and a further control output 102. The control outputs 101 deliver the signals RD (ROM-Disable), DE (Debug-Enable) and DD (Debug-Disable). The additional control output 102 provides the signal RS (ROM-Select). The microprocessor 1 is connected with an internal non-erasable memory 2, a memory 3 and a test interface 4 via connections which are not specified. The internal non-erasable memory 2 has a control input 201 on which a signal RS' (ROM-Select) is active and through which the control input 201 can be activated. The test interface 4 comprises a control input 401 on which a signal DS' (Debug-Select) is active and through which the test interface 4 can be activated. Furthermore, a start signal generator 5, first control means 6 and second control means 7 are provided in the microcontroller. The start signal generator 5 has an output 501 which delivers a signal RN (Reset-Negative).

The first control means 6 include register bit memory cells 61 and 62 having a write input 611 and 621, a read output 612 and 622 and a reset input 613 and 623, respectively. The write inputs 611, 621 are connected with the control outputs 101 of the microprocessor 1. The reset inputs 613, 623 are connected with the output 501 of the start signal generator 5, so that they are biased with the signal RN. The read output 612 is connected with a first input of a NAND gate 64 and the read output 622 is connected via an inverter 63 with a second input of the NAND gate 64. The NAND gate 64 has an output which delivers a signal DSE (Debug-Select-Enabled) and which is connected with a selection input of a multiplexer 65. One signal input of the multiplexer 65 is led out of the microcontroller as connection 601. The signal DS (Debug-Select) is applied to this connection. A second signal input of the multiplexer 65 is biased with the logic level 0 by means of a ground connection. The signal DS' which is supplied to the control input 401 of the test interface 4 is provided on an output of the multiplexer 65.

The second control means 7 include a register bit memory cell 71, an inverter 72 and an AND gate 73. Analogous to the register bit memory cells 61 and 62, the register bit memory cell 71 has a write input 711, a read output 712 and a reset input 713. The write input 711 is connected with one of the control outputs 101 of the microprocessor 1, so that it is biased with the signal RD. The reset input 713 is connected with the output 501 of the start signal generator 5 and the read output 712 is connected with the input of the inverter 72. The inverter 72 delivers a signal RSE (ROM-Select-Enabled) which is supplied to an input of the AND gate 73. A second input of the AND gate 73 is connected with the additional control output 102 of the microprocessor 1 via which the signal RS is delivered. The output of the AND gate 73 provides the signal RS' (ROM-Select) which is supplied to the internal non-erasable memory 2 on its control input 201.

FIG. 1 exemplarily illustrates a selection of components of the microcontroller. Within the framework of the invention, the microcontroller can of course include further components and connections, e.g. for supplying power and for data and signal exchange. Moreover, any illustrated components and the interconnection between the components are partially represented in simplified form. Bus systems which are employed for the purpose of address and data transmission, for instance, are combined in the illustrated interconnection between microprocessor 1, internal non-erasable memory 2 and memory 3.

In the microcontroller illustrated in the Figure, the microprocessor 1 serves for processing system and/or application programs which are stored in the internal non-erasable memory 2 and/or the memory 3. In the embodiment illustrated, the internal non-erasable memory 2 is a ROM (Read Only Memory), in particular in such an implementation which after production or initial programming cannot be deleted and reprogrammed, for instance a PROM (Programmable Read Only Memory) or a so-called fused ROM.

The memory 3 is often termed the working memory of the microcontroller. It may be internally arranged in the microcontroller or can also be an external memory. It can be realized as a volatile memory, e.g. a static or dynamic RAM (Random Access Memory), or as a non-volatile memory, e.g. based on Flash technology. By way of example, an internal volatile RAM memory as memory 3 will be taken as a basis in the following.

In this application, the fact that a device is "internally" arranged in the microcontroller means, for instance, that this device together with other devices of the microcontroller is placed on the same semiconductor substrate also designated with the term Die (Dielectrical Substrate). Likewise, it is possible to arrange different devices on different semiconductor substrates, with these substrates, however, being provided within a common housing which preferably is potted. In respect of function, the term "internal" indicates that neither the device nor interconnections between the device and a further, internal device can be subjected an analysis or manipulation without major effort.

The test interface 4 is provided for checking the functionality of the microcontroller and of the programs executed by the microcontroller during the development phase. This may be an interface according to the JTAG specification, for example. Such an interface which is also referred to as boundary scan interface allows retrieving or presetting signals of all connections of the microcontroller by means of a serial data connection which is not illustrated in FIG. 1. This allows a profound analysis of the functions of the microcontroller including reading out or manipulating data stored within the microcontroller. In FIG. 1, the access to the microcontroller which is made possible by the test interface is symbolized through the interconnection between the test interface 4 and the microprocessor 1.

The test interface 4 has the connection 401 through which it can be activated. With conventional microcontrollers it is known to lead a connection (corresponding to the connection 401) for activating a test interface out of the microcontroller, thus permitting access from outside.

In the embodiment of FIG. 1, the connection 401 is coupled with the external connection 601 via the multiplexer 65. The latter simulates a logic AND conjunction through which the signal DS' active on the control input 401 for activating the test interface 4 is equal to the external signal DS which can be externally applied to the connection 601 only if the signal DSE has the logic level 1. Thus, the signal DSE decides if the test interface can be activated from outside or not.

The logic level of the signal DSE is determined by the two register bit memory cells 61 and 62. These memory cells are adapted such that they can be set by the control outputs 101 of the microprocessor 1 via the signals DE and DD (logic output level 1), but cannot be reset (logic output level 0). Resetting of the register bit memory cells 61 and 62 occurs through the reset connections 613 or 623 which are connected with the start signal generator 5. The start signal generator 5 (also referred to as power-on-reset circuitry) initiates the reset of the register bit memory cell 61 and 62 via signal RN immediately after providing the supply voltage of the microcontroller.

Figure 2:
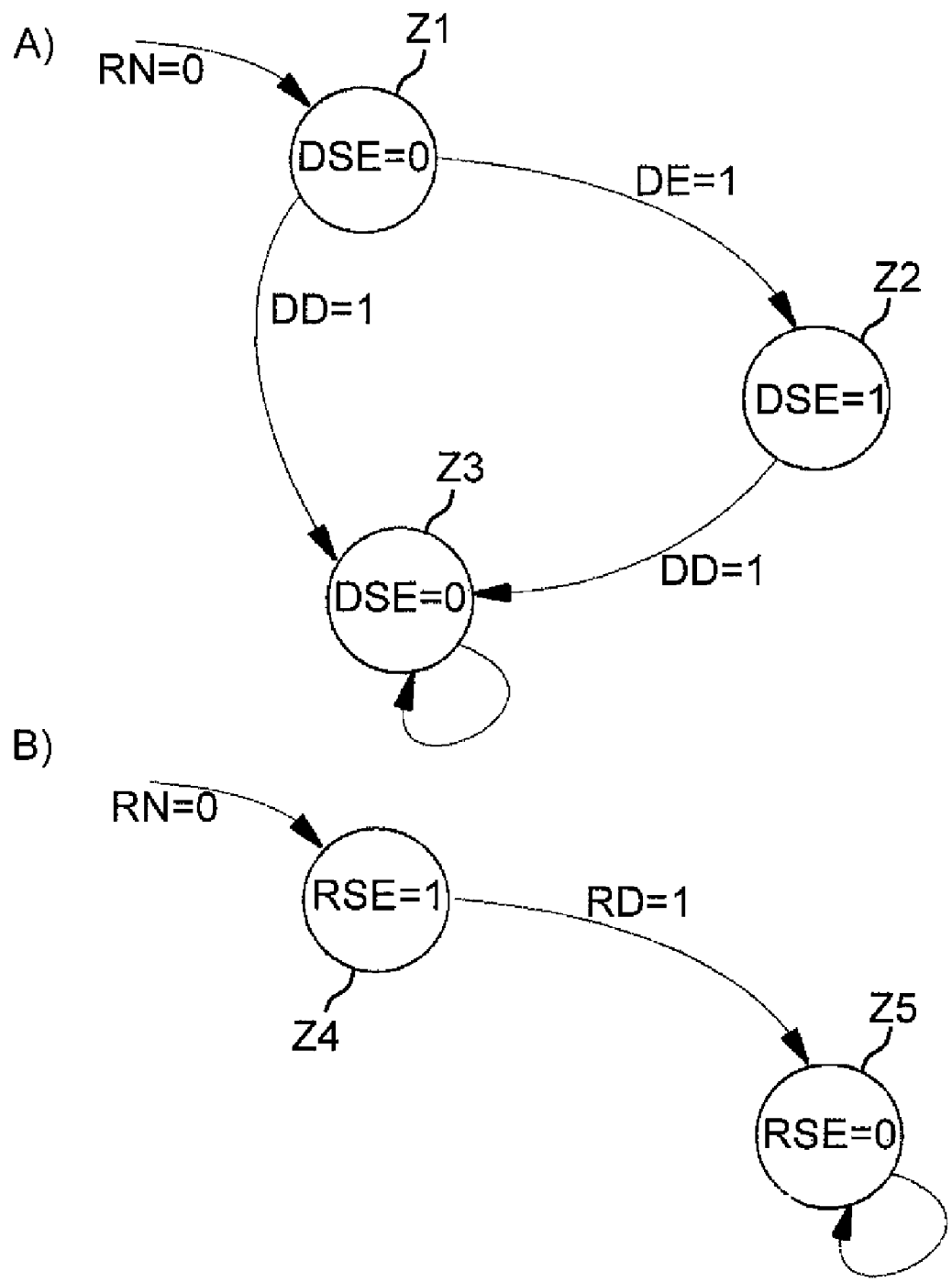
FIG. 2 shows state diagrams for first and second control means.

The mode of operation of the first control means 6 resulting from the interconnection of the register bit memory cells 61 and 62 via the inverter 63, the NAND gate 64 and the multiplexer 65 is illustrated in part A of FIG. 2 in a state diagram. After providing the supply voltage, the test interface 4 cannot be activated from outside for the time being, i.e, through the input 601 (state Z1: DSE=0). Via the signal DE=1, the microprocessor 1 can switch the test interface 4 so as to be activatable from outside (state Z2: DSE=1). Starting from each of the two states Z1 or Z2 the microprocessor 1 can achieve by means of the signal DD=1 that the test interface 4 cannot be activated from outside (state Z3: DSE=0). In the state Z3, the test interface 4 is switched so as to be irreversibly deactivatable; this state Z3 can only be quit by removing and re-supplying the supply voltage.

Basically, a starting operation of a microcontroller may proceed such that, after switching on or resetting the microcontroller by its microprocessor, the internal non-erasable memory is activated and the microprocessor begins with the execution of a so-called bootloader program stored in the internal non-erasable memory.

The function of the bootloader program essentially is to copy an application program which is typically stored in an external non-volatile memory (not shown here) such as a hard disc drive or Flash memory into a working memory, e.g. memory 3 in FIG. 1, and then to initialize the execution of the application program, for instance by a jump instruction to the corresponding start address of the application program.

When the internal non-erasable memory is activated memory contents will be transferred from the internal non-erasable memory to the microprocessor if there exists a predefined and suitable address which is situated within an address range comprised within the internal non-erasable memory. Usually, the microcontroller is adapted such that— when the internal non-erasable memory is not activated—any data will not be taken from this internal non-erasable memory, but from a working memory, e.g. memory 3 in FIG. 1. In doing so, the address ranges which are utilized by the internal non-erasable memory and the working memory, may overlap completely, partially or not at all. Deviating from the embodiment shown in FIG. 1, a memory control device (memory controller) which controls the activation and deactivation of the various memories depending on signal RS' may additionally be provided.

In conventional microcontrollers, for the activation of the internal non-erasable memory the signal RS of the microprocessor is directly used for activating the internal non-erasable memory. Relating to the embodiment of FIG. 1, RS'=RS would be true.

In the embodiment of FIG. 1, the connection 201 is coupled with the additional output 102 of the microprocessor 1 through the AND gate 73 of the second control means 7. Therefore, the signal RS' applied to the control input 201 for activating the internal non-erasable memory 2 is equal to the signal RS delivered by the microprocessor only if the signal RSE exhibits the logic level 1. Accordingly, signal RSE decides if the internal non-erasable memory 2 can be activated by the microprocessor 1 or not.

The logic level of the signal RSE is determined by the register bit memory cell 71. Analogous to the register bit memory cells 61 and 62, this memory cell is adapted such that it can be set by one of the control outputs 101 of the microprocessor 1 via signal RD (logic output level 1), but cannot be reset (logic output level 0). Resetting of the register bit memory cell 71 occurs via signal RN only after provision or re-provision of the supply voltage of the microcontroller.

The mode of operation of the second control means 7, resulting from the interconnection of the register bit memory cell 71, the inverter 72 and the AND gate 73, is illustrated in part B of FIG. 2 in a state diagram. After providing the supply voltage, the internal non-erasable memory 2 can initially be activated via the signal RS by the microprocessor 1 (state Z4: RSE=1). The microprocessor 1 can switch the internal non-erasable memory 2 so as to be deactivatable (state Z5: RSE=0) via the signal RD=1. In the state Z5, the internal non-erasable memory 2 is switched so as to be irreversibly deactivatable; this state Z5 can only be quit by removing and re-supplying the supply voltage.

Figure 3:
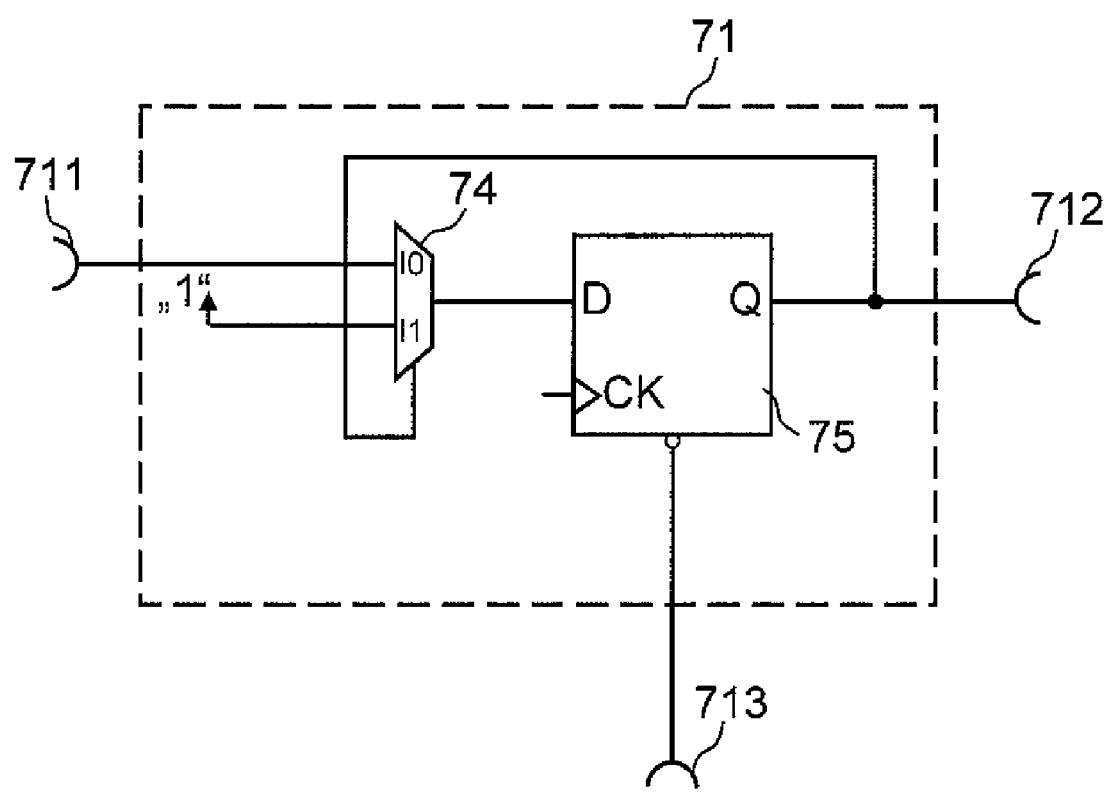
FIG. 3 shows a block diagram of a register bit memory cell of a second control means of a microcontroller.

A possible configuration of the register bit memory cell 71 is illustrated in FIG. 3. As the register bit memory cells 61 and 62 are identical in their function to the register bit memory cell 71, the configuration according to FIG. 3 may be correspondingly transferred to these cells.

The register bit memory cell 71 comprises a multiplexer 74 having two signal inputs and one control input. One of the signals inputs is biased with the logic level 1, and the other constitutes the input 711 of the register bit memory cell 71. The output of the multiplexer 74 is connected with the D-input of a D-flip-flop 75. The D-flip-flop 75 has an output which constitutes the output 712 of the register bit memory cell 71. The output of the D-flip-flop 75 is additionally connected with the control input of the multiplexer 74. A reset input of the D-flip-flop 75 constitutes the reset input 713 of the register bit memory cell 71.

The register bit memory cell 71 is particularly distinguished in that it can be set by the write input 711, but cannot be reset by the same. In the circuit according to FIG. 3 this is achieved in that the output of the D-flip-flop 75 decouples the write input 711 by means of the multiplexer 74 after setting the register bit memory cell 71 from the input of the D-flip-flop 75 and instead biases it with the logic level 1.

Figure 4:
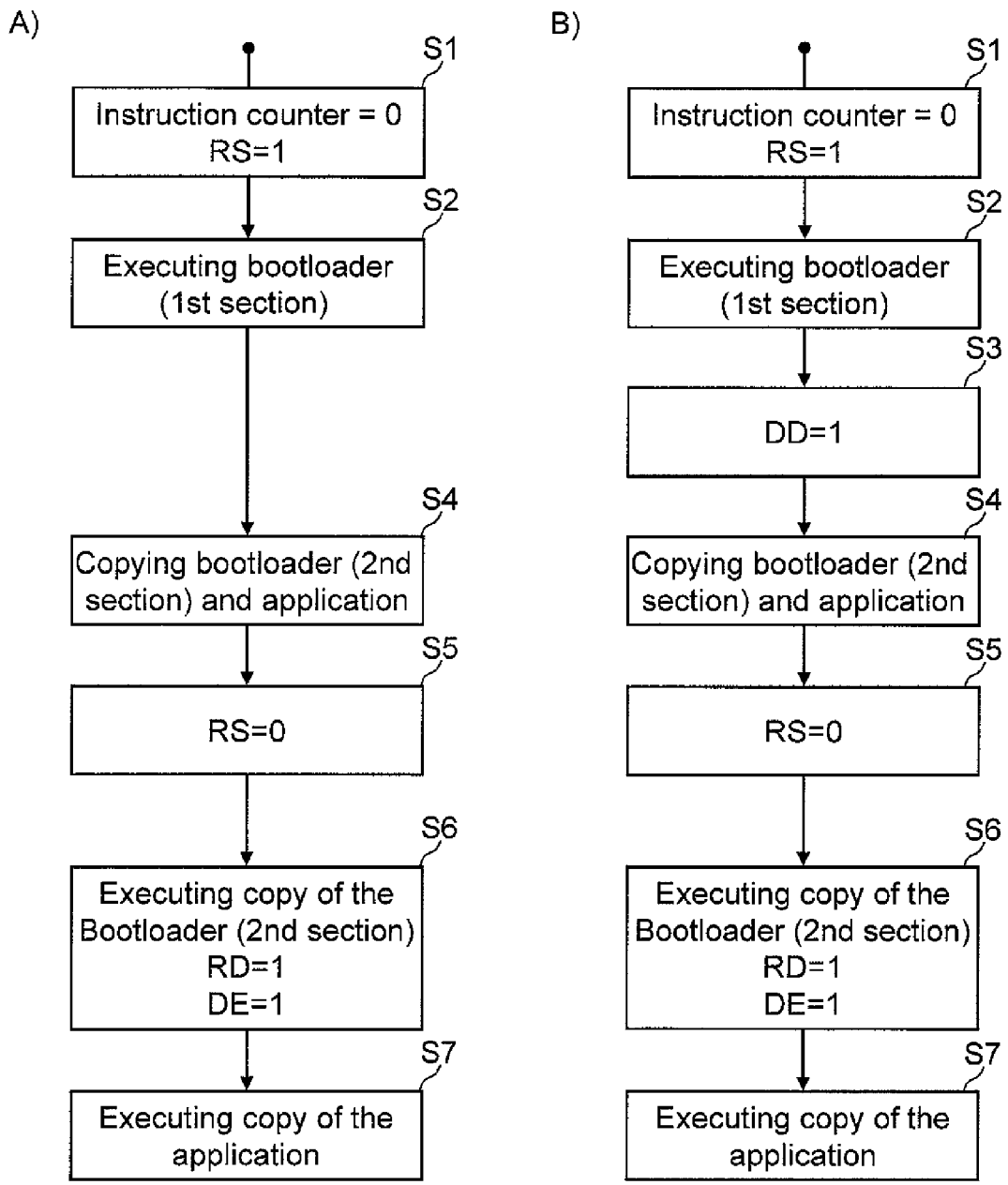
FIG. 4 shows flow diagrams of two methods for starting an application program on a microcontroller.

FIG. 4 illustrates an exemplary progress of two methods for starting an application program on a microcontroller comprising an activatable and deactivatable test interface and an activatable and deactivatable internal non-erasable memory. The processes will be described exemplarily in connection with the microcontroller shown in the embodiment of FIG. 1. The reference numerals which are used in the following therefore correspondingly refer to FIG. 1.

Part A of FIG. 4 shows the flow diagram of a process which is particularly suitable for starting an application program in the development phase.

After the start of the process, an instruction counter of the microprocessor 1 is set to a predefined start value in a first step S1. The instruction counter indicates the address of a next instruction to be processed by the microprocessor 1. The predefined start value typically is address 0. Furthermore, the internal non-erasable memory 2 is activated via the signal RS from the microprocessor 1 in step S1. This activation is possible because the signal RSE of the second control means 7 also exhibits the logic level 1 after providing the supply voltage. The start of the method can be defined, for instance, after providing the service voltage of the microcontroller by a level change of the signal RN delivered by the start signal generator 5.

Provided in the internal non-erasable memory 2 is the so-called bootloader program (in the Figure shortened as bootloader) the execution of which begins in step S2. The process will then continue in a step S4.

In step S4, a second section of the bootloader program will be copied into the memory 3 during the execution of a first section of the bootloader program from the internal non-erasable memory 2. For the example described here, it is to be assumed that the address ranges both of the internal non-erasable memory 2 and of memory 3 begin with the same start address, for instance with address 0. In such a case, the second section of the bootloader program can be copied in memory 3 into the same address range where it is placed within the internal non-erasable memory 2. Furthermore, an application program (in the Figure shortened as application) which is situated in an external non-volatile memory, is copied into an area of memory 3 adjoining the second section of the bootloader program in step S4. In a further development of the method, the application program may exist in the external non-volatile memory in encrypted form. The bootloader program will then be adapted to decrypt the application program prior to copying it into memory 3 with a key which is deposited in the internal non-erasable memory 2. In this way, it will be achieved, one the one hand, that the application program in the external non-volatile memory is protected against any undesired inspection and, on the other hand, that unauthorized application programs which are not encrypted with the corresponding key cannot be executed on the microcontroller.

Thereupon, the signal RS will be set to the logic level 0 in step S5 as the last instruction of the first section of the bootloader program, executed out of the internal non-erasable memory 2. This has the effect that the second section of the bootloader program 3 will be executed out of memory 3 in the following.

In step S6, the signal RD is set to the logic level 1 in this second section of the bootloader program, whereby the register bit memory cell 71 is set and the level of the signal RSE changes to logic 0. This is why the internal non-erasable memory 2 is irreversibly deactivated until the next cut-off and re-supply of the supply voltage. In addition, the signal DE is set to the logic value 1, whereby the register bit memory cell 61 is set. As the register bit memory cell 62 is not set, the setting of the register bit memory cell 61 results in the signal DSE adopting the logic level 1. Consequently, the test interface 4 can be activated via the external connection 601 of the microcontroller.

In a final step S7 the application program is started which was copied into memory 3 earlier, for instance by jump instruction to a start address of the application program.

Figure 5:
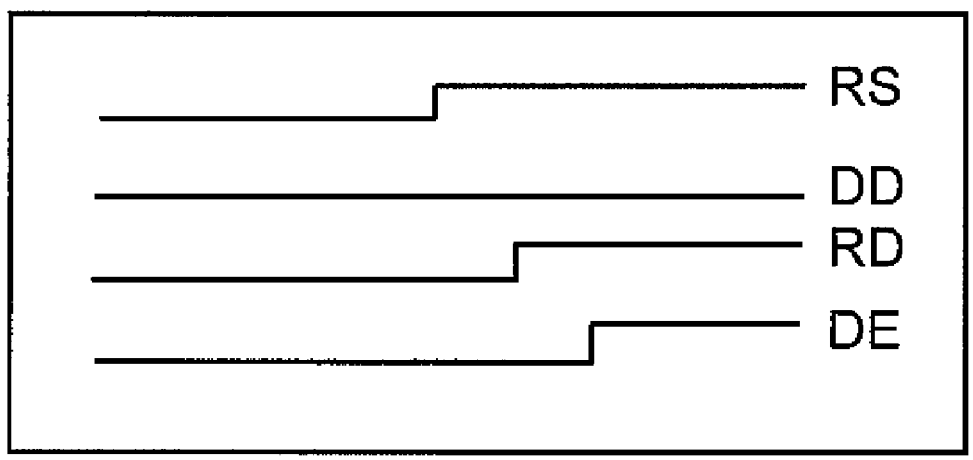
FIG. 5 shows timing diagrams representing the logic level of various signals during the progress of the method shown in FIG. 4.
Figure 5:
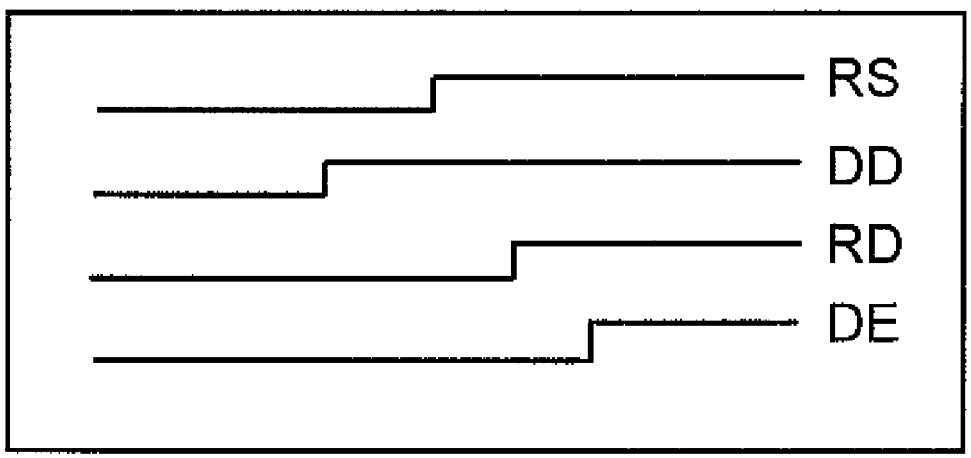

After completion of the process shown in FIG. 4A, the test interface 4 is available to design engineers of the application program for testing purposes or for fault diagnosis. They do not have an opportunity, however, to access contents of the internal non-erasable memory 2 by executing a program code within the application program. Confidential data within this internal non-erasable memory 2, for instance in connection with the Digital Rights Management DRM, can be protected against design engineers of application programs. The chronological progression of the level of various signals in the microcontroller during the progress of the process is graphically represented in part A of FIG. 5 on a horizontal time axis extending from left to right.

In an alternative configuration of the method provision can be made in addition that an unlocking of the test interface 4 in step S6 is linked to predefined criteria which have to be met by the application program itself or by ancillary information pertaining to the application program and provided on the external non-volatile memory. Provision can be made, for instance, that a checksum characterizing the application program or a Hash sequence is made available at the end of an application program or in the ancillary information, that is to say the result of an irreversibly unambiguous mapping function which is compared with a corresponding quantity formed during reading in an application program. The test interface 4 is unlocked only in case of congruence. The algorithm for calculating the corresponding quantity may be dependent on a key sequence here which is known only to authorized application developers. Especially if this method is used with an application program which is stored on the external non-volatile memory in an encrypted manner, the application program is reliably protected against undesired inspection or manipulation, without authorized design engineers being blocked from accessing the test interface 4.

In such a case the first control means 6 could be simplified vis-à-vis the version shown in FIG. 1 to the effect that the signal DE from the microprocessor 1 is directly supplied as signal DSE to the control input of the multiplexer 65. The register bit memory cells 61 and 62, the inverter 63 and the NAND gate 64 may be omitted, as may the signal DD.

In part B of FIG. 4, a method is specified which is suitable in particular for microcontrollers which are employed in products and on which no further application program development is planned. Steps S1 and S2 as well as S4 to S7 of the method correspond to the steps illustrated in part A of FIG. 4. Unlike above, a further step S3 is executed here between step S2 and step S4, in which the signal DD from the microprocessor 1 is set to the logic level 1. In consequence thereof, the register bit memory cell 62 sets the signal DSE irreversibly to the level 0 until the supply voltage is cut off the next time and re-supplied. The chronological progression of the level of various signals in the microcontroller during the progress of the method is graphically represented in part B of FIG. 5 like in the method described above.

Neither step S6 which will be carried out in the method at a later point in time and in which the signal DE is set to logic 1, nor any other instructions which optionally are carried out by the application program are suited to activate the test interface 4. It is of advantage here that the product version and the design engineer version of the bootloader program differ only slightly by the instructions of step S3. In the event that the bootloader program is written into the internal non-erasable memory 2 by means of an exposure mask during manufacture of the microcontroller, it will be possible to produce an exposure mask for the product version by slightly modifying the exposure mask for the development version. Alternatively, the process of setting the signal DE in step 6 may be dispensed with in the product version of the bootloader program.

The invention claimed is:

1. A microcontroller comprising:
   a microprocessor, a test interface and an internal non-erasable memory;
   first control means within the microcontroller to activate and deactivate the test interface, the first control means comprising a register bit memory cell having a write input connected to a control output of the microprocessor and a read output coupled to a control input of the test interface; and
   second control means within the microcontroller to activate and deactivate the internal non-erasable memory, the second control means comprising a register bit memory cell having a write input connected to another control output of the microprocessor and a read output coupled to a control input of the internal non-erasable memory;
   wherein the microprocessor comprises control outputs which are coupled to the first and second control means, such that the test interface and the internal non-erasable memory can be activated and deactivated by the microprocessor.

2. The microcontroller according to claim 1, wherein the test interface is an interface according to the JTAG specification.

3. The microcontroller according to claim 1, wherein the internal non-erasable memory is a mask-programmed ROM, a PROM or a fused ROM.

4. The microcontroller according to claim 1, wherein the microcontroller is configured such that, after providing a supply voltage for the microcontroller, the microprocessor processes a program code as from an instruction address which lies within an address range associated with the internal non-erasable memory.

5. The microcontroller according to claim 3, wherein the first control means are configured such that the test interface is deactivated after providing a supply voltage for the microcontroller.

6. The microcontroller according to claim 1, wherein the first control means are configured such that the test interface is activated and deactivated by the microprocessor.

7. The microcontroller according to claim 6, wherein the first control means are configured such that the test interface can be deactivated by the microprocessor, this process being irreversible for the test interface.

8. The microcontroller according to claim 1, wherein the second control means are configured such that the internal non-erasable memory is activated after providing a supply voltage for the microcontroller.

9. The microcontroller according to claim 1, wherein the second control means are configured such that the internal non-erasable memory is activated and deactivated by the microprocessor.

10. The microcontroller according to claim 9, wherein the second control means are configured such that the internal non-erasable memory is deactivated by the microprocessor, this process being irreversible for the internal non-erasable memory.

11. A method for starting an application program on a microcontroller comprising a test interface which can be activated and deactivated, and an internal non-erasable memory which can be activated and deactivated, wherein the method comprises the steps of:
    deactivating the test interface by a microprocessor via first control means comprising a register bit memory cell having a write input connected to a control output of the microprocessor and a read output coupled to a control input of the test interface;
    activating the internal non-erasable memory by the microprocessor via second control means comprising a register bit memory cell having a write input connected to another control output of the microprocessor and a read output coupled to a control input of the internal non-erasable memory;
    executing a first section of a bootloader program provided in the internal non-erasable memory;
    preparing a copy of a second section of the bootloader program in a memory during the execution of the first section of the bootloader program;
    preparing a copy of an application program provided in an external non-volatile memory in memory during the execution of the first section of the bootloader program;
    executing the copy of the second section of the bootloader program;
    deactivating the internal non-erasable memory by the microprocessor via the second control means during the execution of the copy of the second section of the bootloader program; and
    executing the copy of the application program.

12. The method according to claim 11, wherein the copy of the application program is checked during the execution of the copy of the second section of the bootloader program; and wherein the test interface is activated only if the copy of the application program meets predefined criteria.

13. The method according to claim 12, wherein the predefined criteria are stored in the internal non-erasable memory.

14. The method according to claim 12, wherein the check of the copy of the application program includes calculation of a Hash sequence aided by an irreversibly unambiguous mapping function for at least a part of the application program.

15. The method according to claim 11, wherein the application program is stored on the external non-volatile memory in encrypted form and wherein, during the execution of the first section of the bootloader program, the application program is decrypted by a key which is stored in the internal non-erasable memory prior to the preparation of its copy.

16. The microcontroller according to claim 1, wherein the microcontroller comprises a start signal generator which includes an output connected to a reset input of the register bit memory cell of the first control means.

17. The microcontroller according to claim 16, wherein the register bit memory cell of the second control means comprises a reset input connected to an output of the start signal generator.

* * * * *